United States Patent
Kappertz et al.

(10) Patent No.: US 9,112,072 B2
(45) Date of Patent: Aug. 18, 2015

(54) METHOD FOR PRODUCING A COATED ITEM BY MEANS OF TEXTURE ETCHING

(75) Inventors: Oliver Kappertz, Paderborn (DE); Lothar Herlitze, Derental (DE); Hansjoerg Weis, Hoexter (DE); Michael Purwins, Offensen (DE)

(73) Assignee: Interpane Entwicklungs-und, Beratungsgesellschaft mbH, Lauenfoerde (DE)

( * ) Notice: Subject to any disclaimer, the term of this patent is extended or adjusted under 35 U.S.C. 154(b) by 96 days.

(21) Appl. No.: 13/375,166

(22) PCT Filed: Jan. 27, 2011

(86) PCT No.: PCT/EP2011/000371
§ 371 (c)(1),
(2), (4) Date: Nov. 29, 2011

(87) PCT Pub. No.: WO2011/092017
PCT Pub. Date: Aug. 4, 2011

(65) Prior Publication Data
US 2012/0067618 A1    Mar. 22, 2012

(30) Foreign Application Priority Data
Jan. 27, 2010 (DE) .......... 10 2010 005 888
May 19, 2010 (DE) .......... 10 2010 020 994

(51) Int. Cl.
*H01L 31/0236* (2006.01)
*H01L 31/0224* (2006.01)
(Continued)

(52) U.S. Cl.
CPC .. *H01L 31/02366* (2013.01); *H01L 31/022483* (2013.01); *H01L 31/1888* (2013.01); *G02F 1/13439* (2013.01); *Y02E 10/50* (2013.01)

(58) Field of Classification Search
USPC ............. 136/256; 174/126.1; 204/192.29, 204/192.38; 216/28; 313/512; 361/311; 428/332, 432, 697, 699, 702, 22, 463, 428/98
See application file for complete search history.

(56) References Cited

U.S. PATENT DOCUMENTS 3,485,658 A * 12/1969 Iler .................... 428/328
4,554,727 A * 11/1985 Deckman et al. ........... 438/71
(Continued)

FOREIGN PATENT DOCUMENTS

| EP | 1577949 A1 | 9/2005 |
| WO | 2007/018975 A1 | 2/2007 |
| WO | 2009/019376 A2 | 2/2009 |

OTHER PUBLICATIONS

Hodes, Semiconductor and ceramic nanoparticle films deposited by chemical bath deposition, 2007, Physical Chemistry Chemical Physics, 9, 2181-2196.*

(Continued)

*Primary Examiner* — Duy Deo
*Assistant Examiner* — Erin Bergner
(74) *Attorney, Agent, or Firm* — Kenneth E. Horton; Kirton McConkie

(57) ABSTRACT

The invention relates to a method for manufacturing a coated object (2) through deposition of at least one transparent, conductive metal-oxide layer (3) on a substrate (5), comprising the deposition (I) and preferably subsequent temperature treatment (II) of the coating (3). After the optional temperature treatment (II), the surface texture (8) of the coating (3) is statistically adjusted through an etching process.

22 Claims, 10 Drawing Sheets

Figure 1:
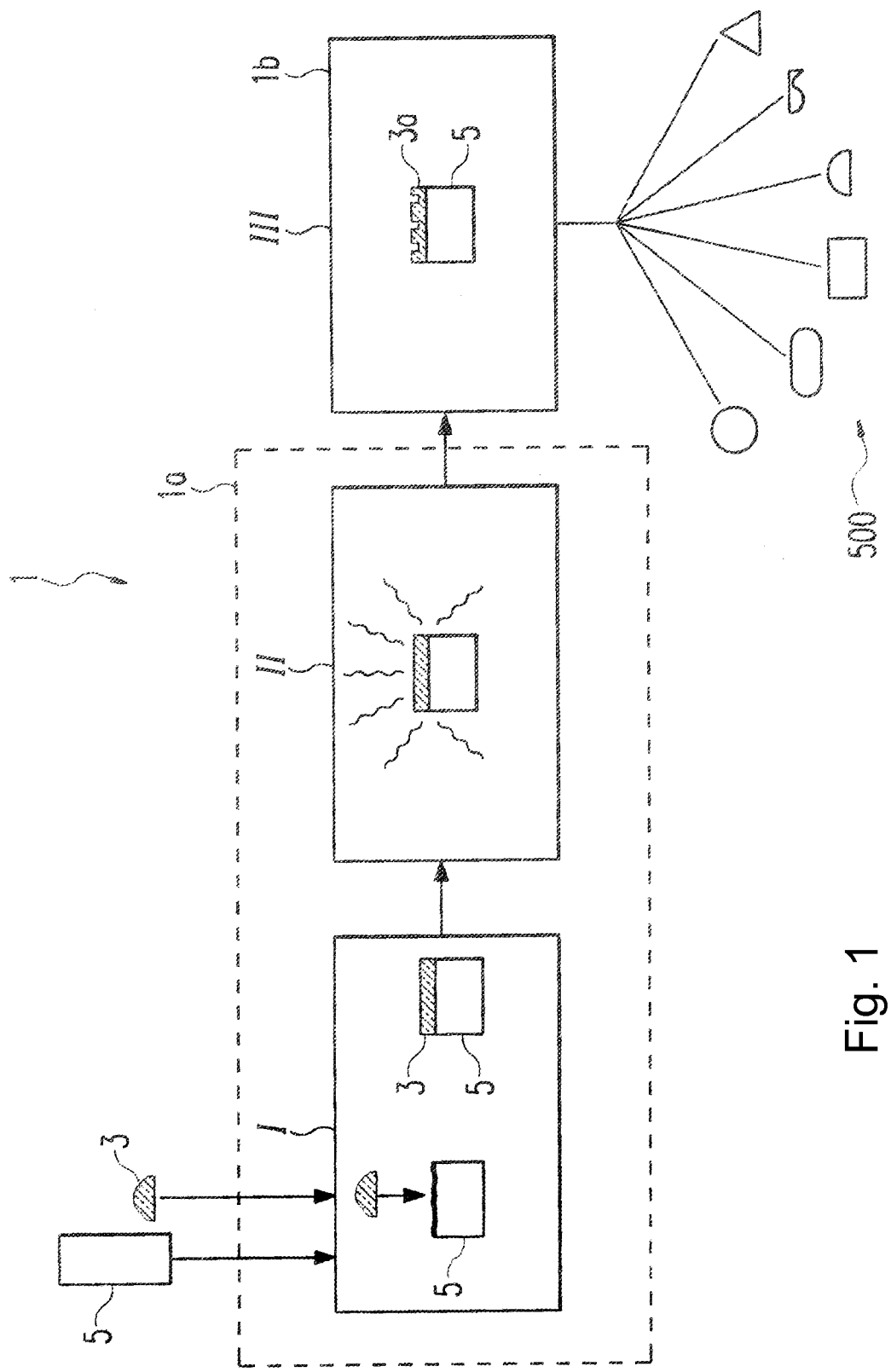

(51) Int. Cl.
　　*H01L 31/18*　　　(2006.01)
　　*G02F 1/1343*　　(2006.01)

(56) References Cited

U.S. PATENT DOCUMENTS

| | | | | |
|---|---|---|---|---|
| 4,728,406 | A * | 3/1988 | Banerjee et al. | 204/192.29 |
| 4,732,621 | A | 3/1988 | Murata et al. | |
| 6,127,377 | A * | 10/2000 | Duflos et al. | 514/283 |
| 6,576,302 | B1 * | 6/2003 | Mizuta et al. | 427/597 |
| 2004/0142809 | A1 * | 7/2004 | Pinckney | 501/10 |
| 2007/0082418 | A1 | 4/2007 | Wuu et al. | |
| 2007/0297966 | A1 * | 12/2007 | Fujimoto et al. | 423/305 |
| 2008/0194774 | A1 * | 8/2008 | Kimura et al. | 525/440.03 |
| 2009/0194157 | A1 * | 8/2009 | den Boer et al. | 136/256 |
| 2010/0003781 | A1 | 1/2010 | Van Duren et al. | |
| 2010/0209673 | A1 * | 8/2010 | Viasnoff et al. | 428/172 |

OTHER PUBLICATIONS

PCT Application No. PCT/EP2011/00371 International Preliminary Report on Patentability, Aug. 22, 2012, International Bureau of WIPO, Germany.

* cited by examiner

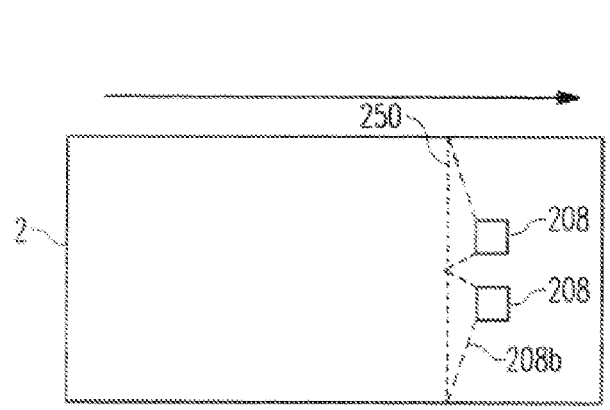
Fig. 4a
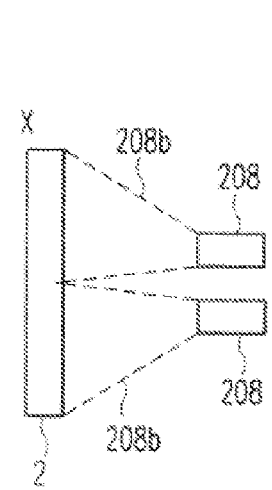
Fig. 4b
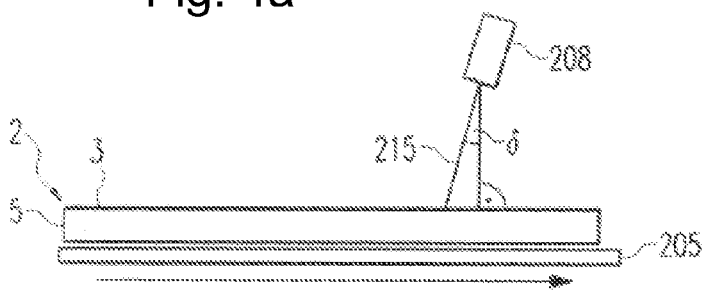
Fig. 4c
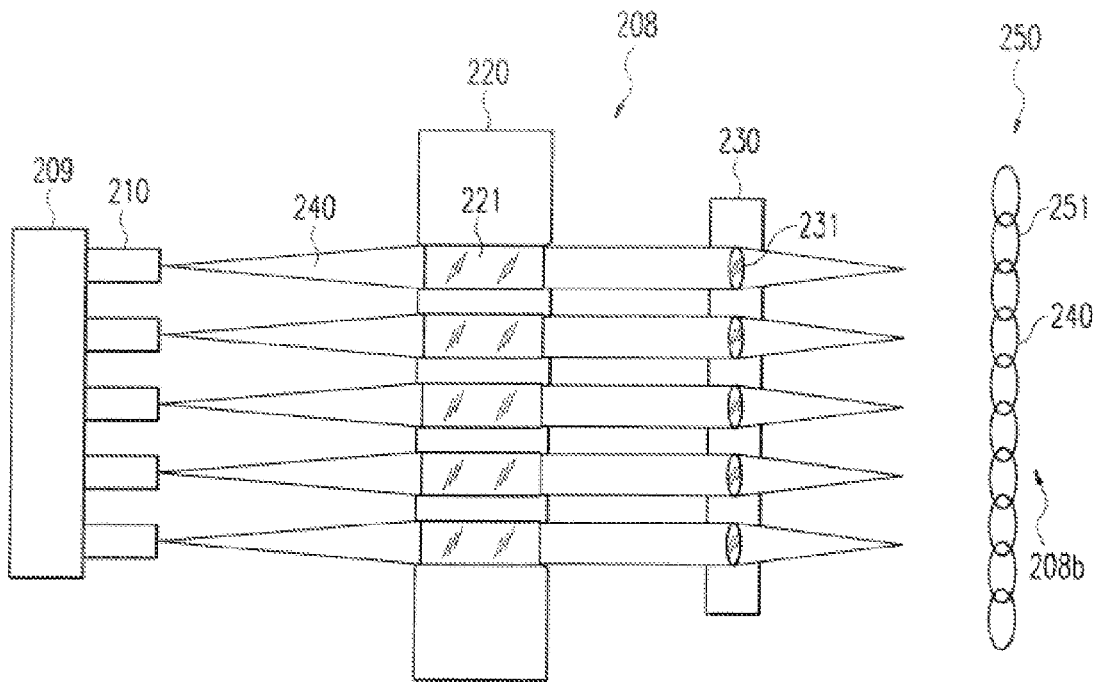
Fig. 5a
Fig. 5b

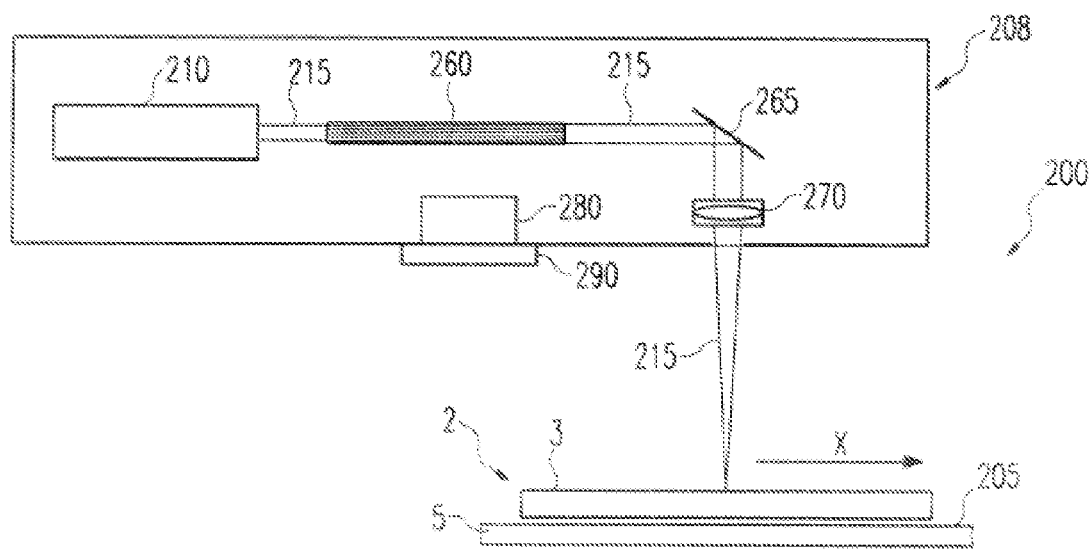
Fig. 12a
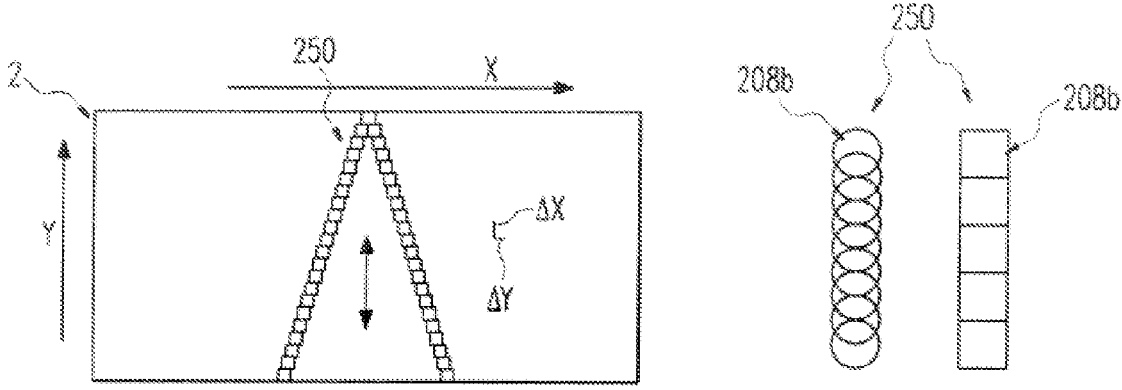
Fig. 12b
Fig. 12c

METHOD FOR PRODUCING A COATED ITEM BY MEANS OF TEXTURE ETCHING

The invention relates to a method for manufacturing a coated object, wherein the coating is both transparent and also conductive, and an object manufactured in this manner.

Transparent, conductive surfaces can be used in a variety of ways. In this context, the function as a transparent front electrode in thin-layer solar cells and in flat screens is of particular relevance. Other applications include contacts for electroluminescence sources, for controlling liquid crystals, electro-chrome coatings, transparent heating elements and anti-fogging coatings (English: anti-fogging). With corresponding reflection properties in the infrared range, applications in the field of radar anti-reflection, thermal protection and fire prevention are also possible.

The manufacture of these coatings is usually very costly as a result of the combination of the contradictory properties of transparency and conductivity. In particular, high temperatures of the object to be coated are required. Especially in the case of vacuum coating methods, heating during the process represents a considerable problem, which can only be solved at high cost. Additionally, the coating must provide a given roughness for use in solar cells, in order to guarantee an adequate scattering of light. Conversely, the light scattering for other potential applications must usually be as low as possible. Accordingly, the surface texture represents the third layer property after conductivity and transparency, which must be fulfilled at the same time.

One possible procedure here is, for example, to coat a glass strip with tin oxide directly after manufacture while still at approximately 600° C. In this case, all three parameters are set simultaneously; such a process offers only correspondingly restricted possibilities for optimisation.

Another method is to apply zinc oxide at approximately 300° C. in a vacuum coating, and to adjust the surface texture through an additional etching step. The problem here is to heat the substrate uniformly and efficiently and then to cool it down again in a controlled manner without the occurrence of thermal fractures.

The tempering of TCO coatings under vacuum is in fact known from WO 2007/018975 A1, but without texture etching.

The object of the present invention is to provide a method for manufacturing a coated object and an object of this kind, which avoid/s the disadvantages mentioned above, wherein the electrical conductivity, optical transparency and scattering of the coated object can be adjusted.

The object is achieved with the method according to the invention by the features of the independent claims. The dependent claims specify advantageous further developments of the method, the system and the product according to the invention.

The invention is based upon a complete separation of the individual process steps of deposition of at least one transparent conductive metal-oxide layer on a substrate, comprising the deposition and optionally subsequent temperature treatment of the coating, and the statistical adjustment of the surface texture of the coating using an etching method.

An etching method in which a mask is applied to the coating before the etching through sputtering as a non-closed layer or in islands has proved particularly advantageous. By preference, the mean thickness of the mask is a maximum of 15 nm, by further preference a maximum of 10 nm, by particular preference a maximum of 5 nm. The materials for the mask can be selected from materials which are etched more slowly in HCl than Al-doped $ZnO_x$ ($x \leq 1$); by preference, they are selected from $SnO_x$, $SnZnO_x$, $TiO_x$, $SiO_x$, Al-doped $SiO_x$, $InSnO_x$ (ITO), especially $InSnO_x$ (ITO) enriched with N or C, wherein $x \leq 2$.

As a second method of the etching process, a mask is generated in situ on the coating before the etching, especially using a wet-chemical immersion or spraying process with the use of a complex-former. At least one member of the group comprising oxalic acid, malonic acid and acetyl acetone, preferably oxalic acid or malonic acid is preferably used here as the complex-former. In this manner, insoluble metal-complex salts are deposited in heaps on the substrate, wherein the heaps are distributed statistically on the surface of the substrate. For example, with the use of zinc oxide as a coating, zinc malonate or zinc oxalate are formed. The formation of heaps can be further improved, if a non-complex-forming acid, preferably a mono-carboxylic acid, by particular preference acetic acid, is used at the same time as or after the addition of the complex-former. In this manner, the contrast between metal-oxide heaps and substrate is more pronounced, which is advantageous for the formation of the mask.

As a third method of the etching process, a non-reactive powder, preferably at least one member of the group comprising $Al_2O_3$, $SiO_2$ and $BaSO_4$ is mechanically deposited on the coating before the etching in order to generate a mask.

As a fourth method of the etching process, oligomers, preferably siloxane oligomers are scattered onto the coating and selectively bonded before the etching in order to generate a mask.

After the generation of a mask, the etching is preferably implemented with at least one Brønsted or Lewis acid, preferably with at least one member from the group comprising acetic acid, citric acid, formic acid, iron trichloride, aluminium trichloride and hydrochloric acid, by particular preference hydrochloric acid.

With regard to the method step of the deposition of at least one transparent conductive metal-oxide layer on a substrate implemented before the etching process, wherein the method step comprises the deposition and subsequent temperature treatment of the coating, the following is preferred:
the coating is preferably manufactured from $ZnO_y$, preferably $ZnO_y$ doped with Al, especially $ZnO_y$ doped with up to 2 at. % Al relative to Zn, wherein $0 < y \leq 1$.

The application of the coating is preferably implemented with a maximum substrate temperature of 180° C., by further preference a maximum of 160° C., by even greater preference a maximum of 150° C., by special preference a maximum of 130° C. This can be achieved, for example, if an additional heating of the substrate before the start of the deposition is dispensed with.

The most important physical parameter of the method according to the invention for adjusting the electrical conductivity and the optical transparency through a subsequent temperature treatment is the temperature T in the temperature treatment of the coating applied. It has been shown that the temperature treatment can be implemented particularly effectively by means of laser irradiation. With this approach, the temperature treatment can be implemented both in atmospheric air and also under vacuum.

A beam geometry in which the laser beam is embodied as a narrow line through corresponding optics has proved particularly advantageous. This line is generated, for example, by coupled laser diodes or coupled Nd:YAG- or Er:YAG laser or Ho:YAG-laser or $CO_2$ laser or Yb:YAG-lasers, for example, as rod or disc lasers, at the wavelength of which the layer is absorbent. The frequency may possibly have to be multiplied.

The laser treatment according to the invention in a laser irradiation device according to the invention brings about an improvement in the conductivity of the coating, thereby simultaneously improving the transparency in the visible range. These improvements are so clear that it is possible with this method to deposit the layers cold, which usually leads to low charge-carrier concentrations and charge-carrier mobilities at the same time as poor transparency, and, with this follow-on treatment, to achieve layer properties comparable with layers deposited in a hot process.

As a second method for temperature treatment, the heating in a high-convection furnace by ventilators and radiant heaters or in a two-chamber furnace with a hot-air fan and radiant heaters is advantageously used, preferably outside a vacuum. The high-convection furnace and the two-chamber furnace have the advantage that the coating and the substrate are heated very uniformly, that is to say, very homogeneously, wherein glass is also preferably used as the substrate in this variant. With a high-convection furnace and also with a two-chamber furnace, the creation of a vacuum is advantageously not required, because the thermal transfer takes place through convection.

Specific resistances between 80 µΩcm and 5000 µΩcm can be adjusted, dependent upon the layer material and the doping. Dependent upon the application, layer resistances, for example, between $1\Omega_{sq}$ and $500\Omega_{sq}$ are possible, which corresponds to layer thicknesses between 30 nm and 2 µm dependent upon the base material and the doping.

The metal-oxide layer comprises substantially, for example, zinc oxide, cadmium oxide, tin oxide, indium oxide or mixtures of two or more of these oxides. The metal-oxide layers are preferably doped.

The following listing contains examples of metal oxides and their dopings used according to the invention. With regard to the metal-oxide layers, there are, in principle, two types: n-doped and p-doped layers. The following compounds are used as n-doped layers: indium tin oxide (ITO) or a compound of the structure II-VI:III, wherein II denotes Zn, Cd, Hg, Be, Mg, Ca, Sr, Ba,
III denotes B, Al, Ga, In, Sc, Y, La, Ce, Pr, Nd, Sm, Eu, Gd, Tb, Dy, Ho, Er, Tm, Yb, Lu, Cr, Mo, W
and IV denotes a single-atom oxygen, wherein ZnO:Al, ZnO:Ga, ZnO:B are used in particular,
or a compound of the structure
$IV-VI_2$:V, wherein
IV denotes Sn, Pb, Ti, Zr, Hf,
VI denotes O, S, Se
and V denotes V (Vanadium), Nb, Ta, P, As, Sb.

In particular, $SnO_2$:Sb and $TiO_2$:Nb are used with this structure. A doping with VII in place of VI is also possible, wherein VII can be F or Cl.

With regard to the p-types, the following compounds are used:
$IV-VI_2$:III, that is, especially $TiO_2$:Cr,
$I-III-VI_2$ with I=Cu, Ag, (Au), Li, especially $CuAlO_2$, $CuCrO_2$ in each case with complex doping options,
$I_2-II-IV-VI_4$, especially $Cu_2ZnSnO_4$, and also with complex doping options. A doping with V in place of VI is also possible, wherein V here denotes N or P.

One or more of the elements S, Se, Ca, Mg, Sr can be present in order to control the position of the valency and conduction bands and therefore also the optical band gap. The concentration of these additional elements is preferably between 2 at. % and 20 at. %.

The charge-carrier concentration and accordingly the electrical conductivity is adjusted by adding doping elements such as Al, but also B, Ga, In, F, Cl, P, As, Sb. In this context, zinc oxide is preferably doped with Al and tin oxide is preferably doped with F. In the case of an indium-doped tin oxide, the proportions of indium are preferably 60% to 95%, by particular preference 90%, and the proportions of tin are preferably 5% to 40%, by particular preference 10% (in at. %). This indium-doped tin oxide is intrinsically conductive. The concentration of the doping elements for adjusting the electrical conductivity is between a 0.1 at. % and 10 at. %, preferably between 0.2 at. % and 6 at. %, by particular preference between 0.4 at. % and 3 at. %, with reference to the metal content.

Figure 2:
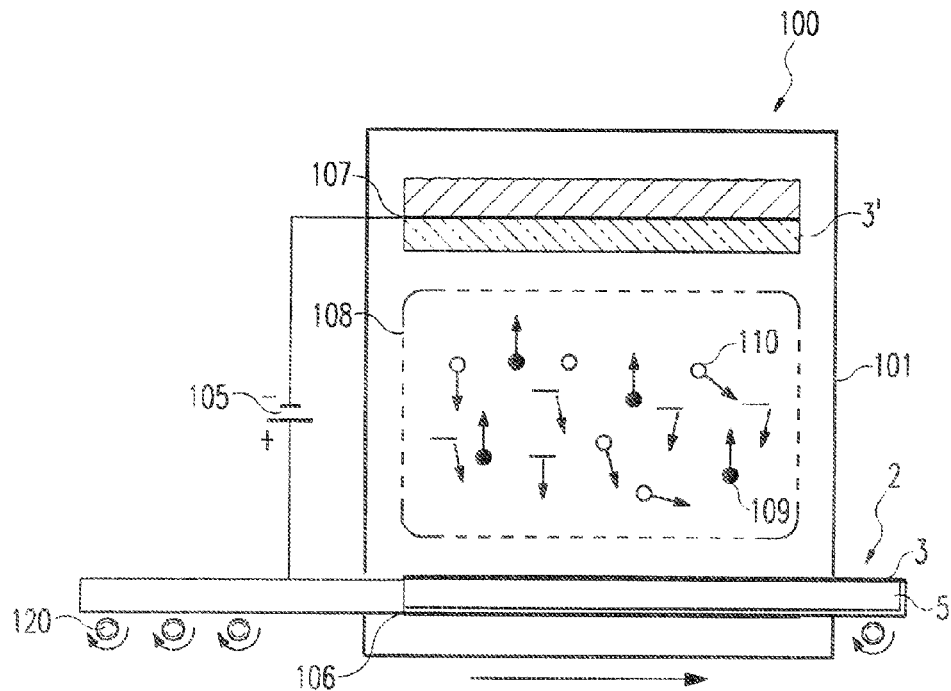
Figure 3:
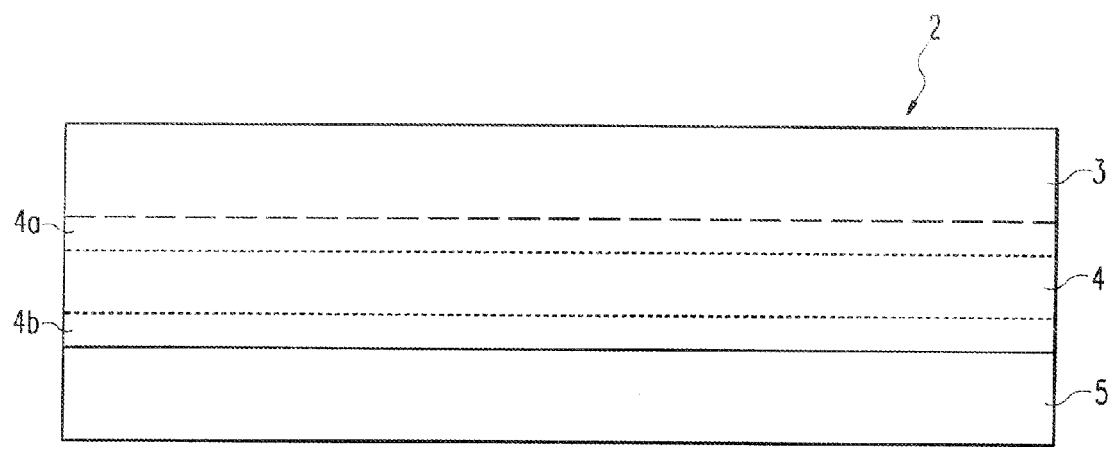
Figure 6:
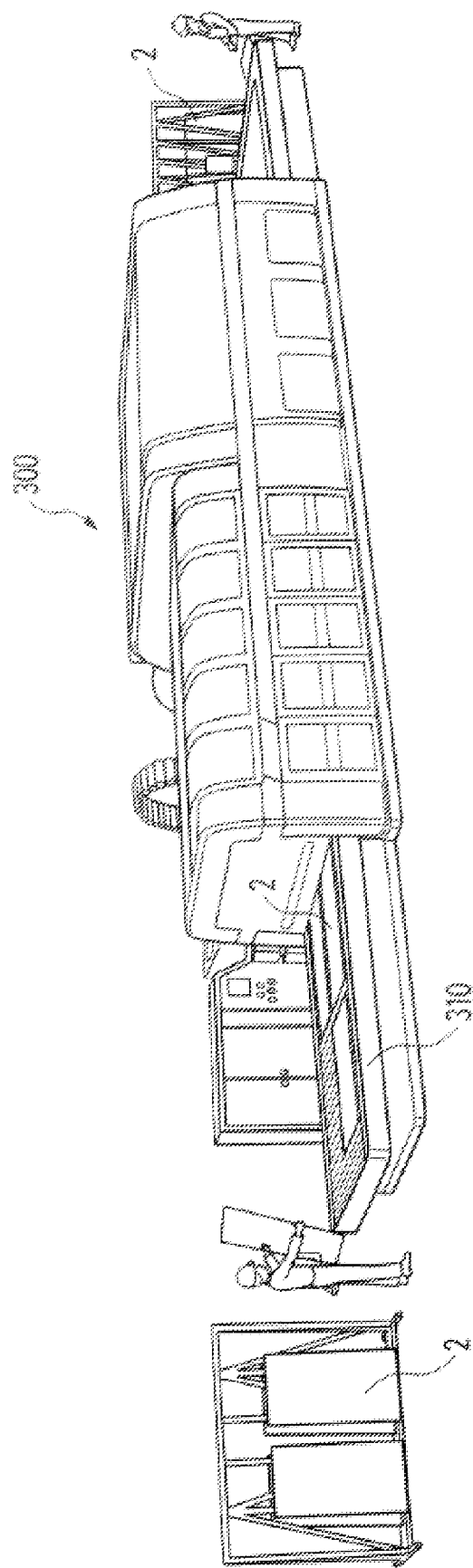
Figure 7:
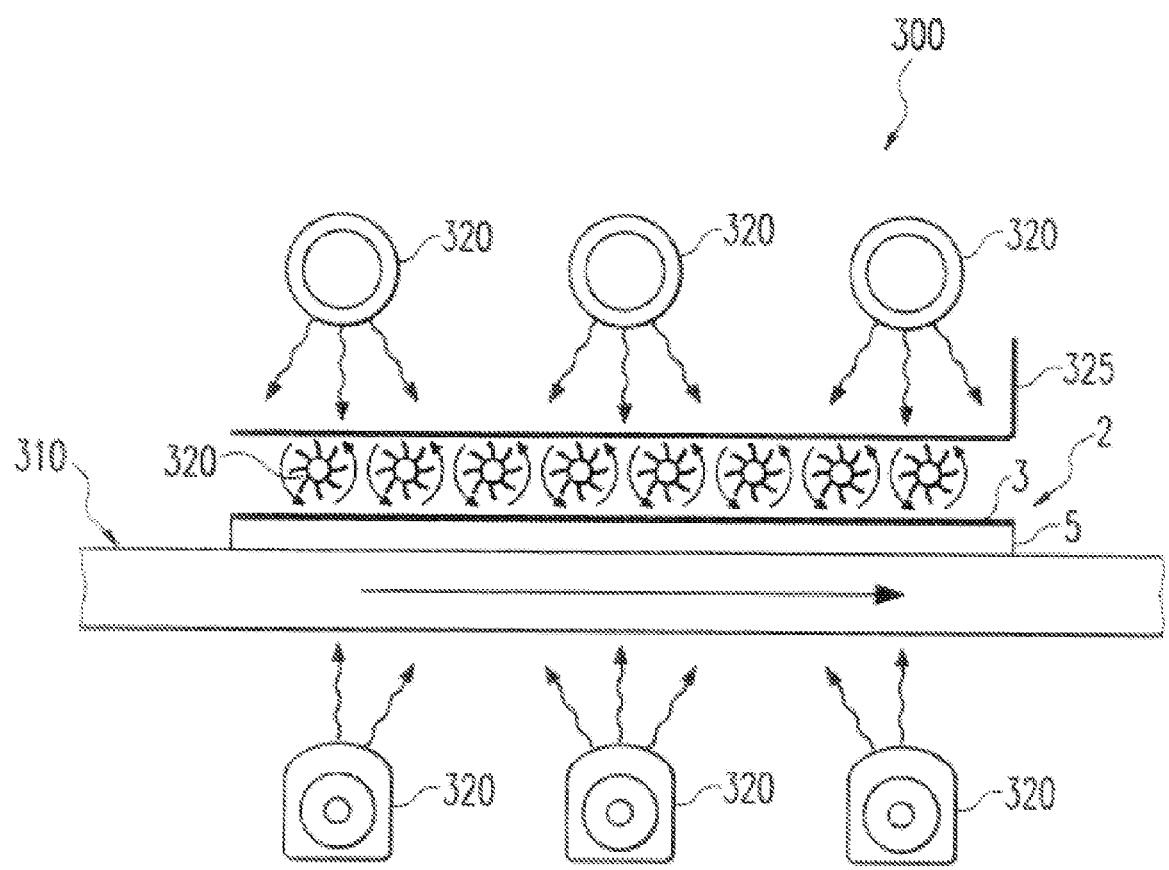
Figure 8:
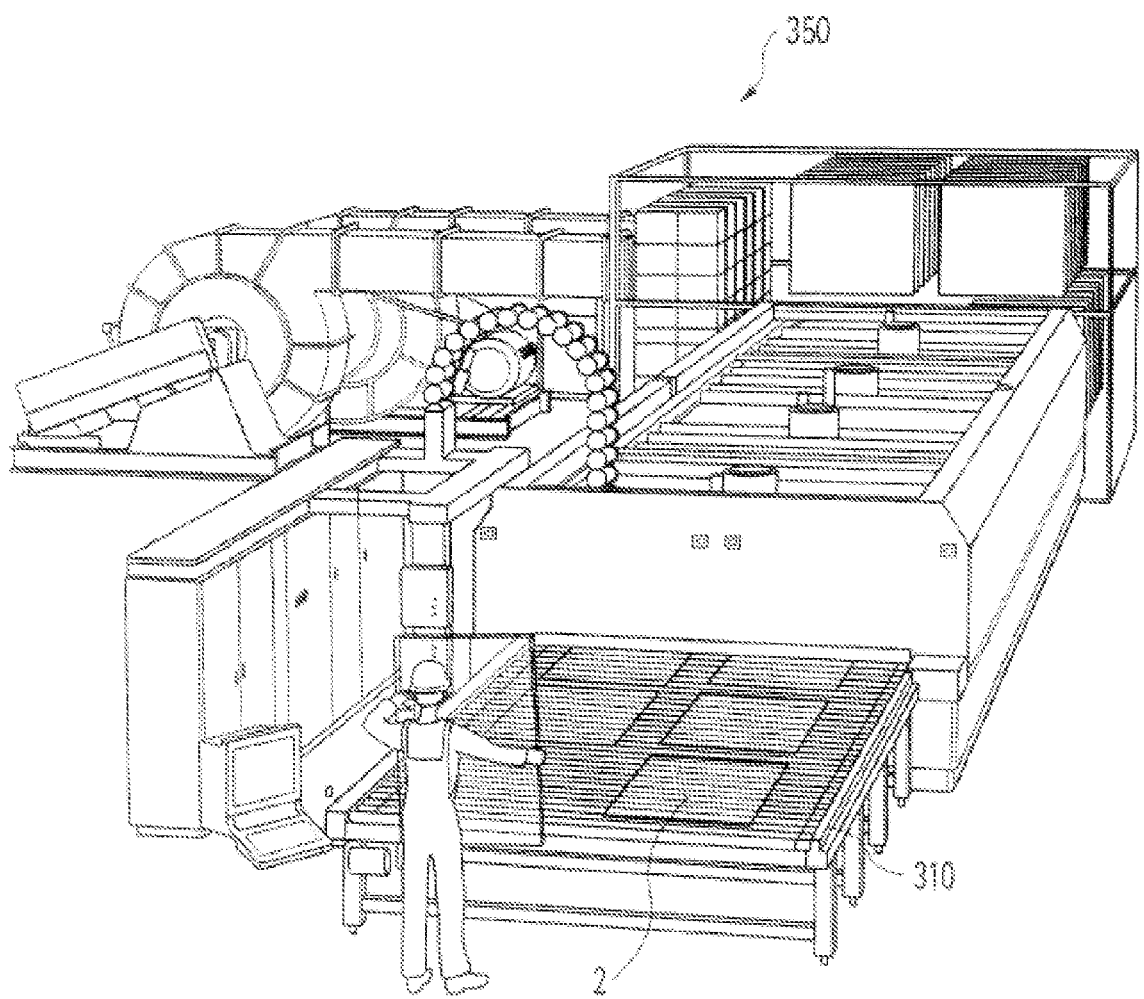
Figure 9:
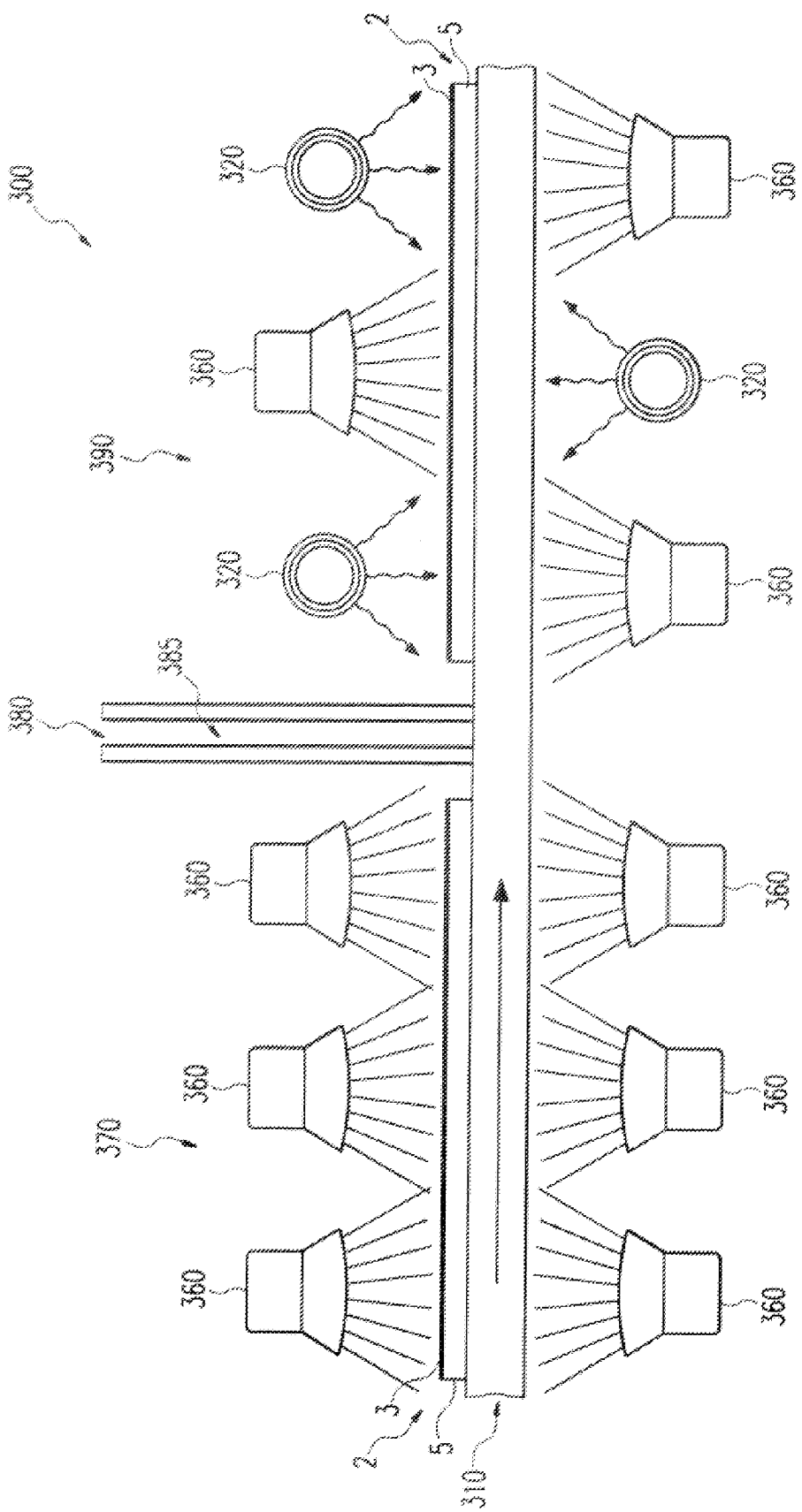
Figure 10:
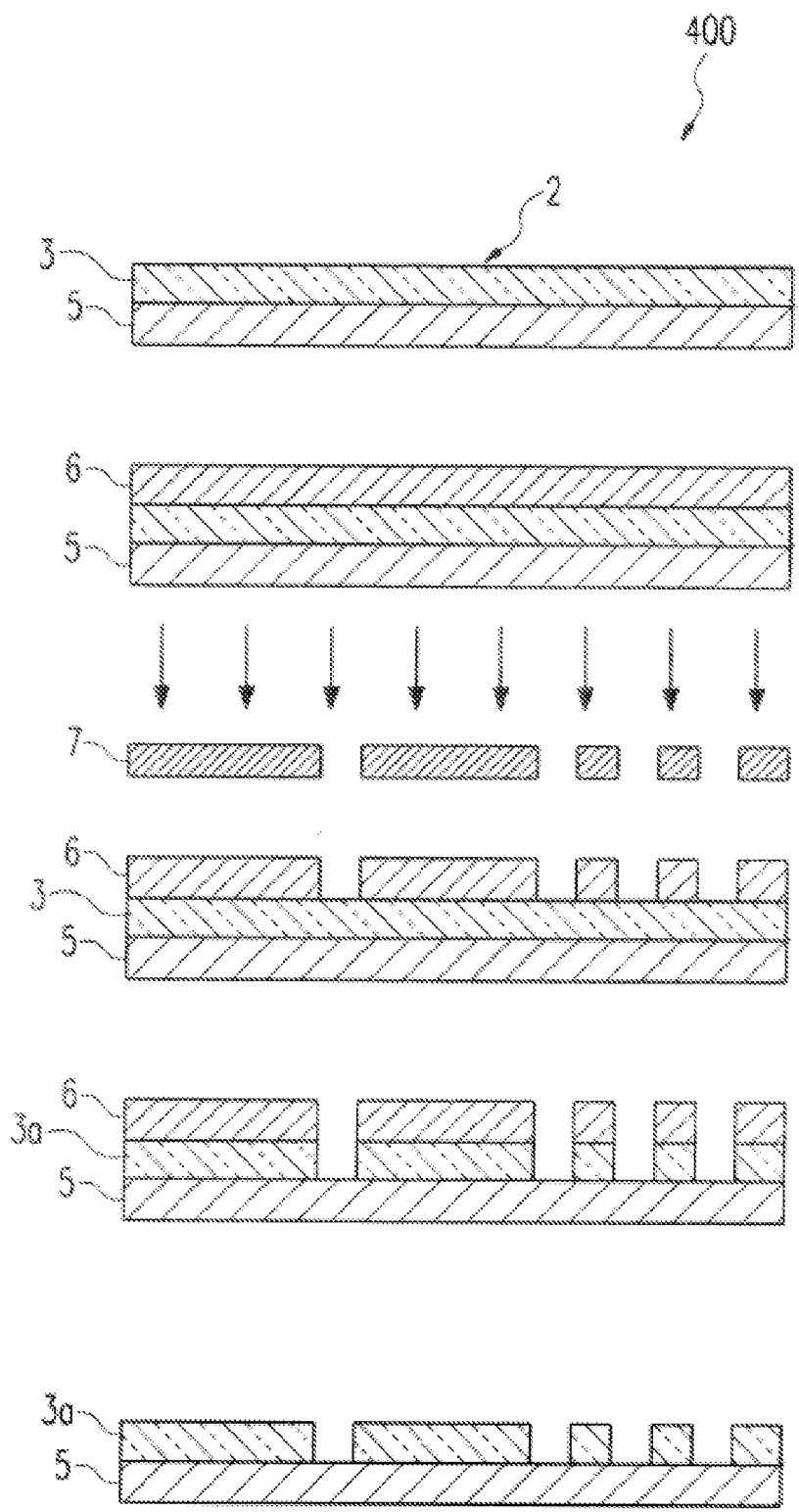
Figure 11A:
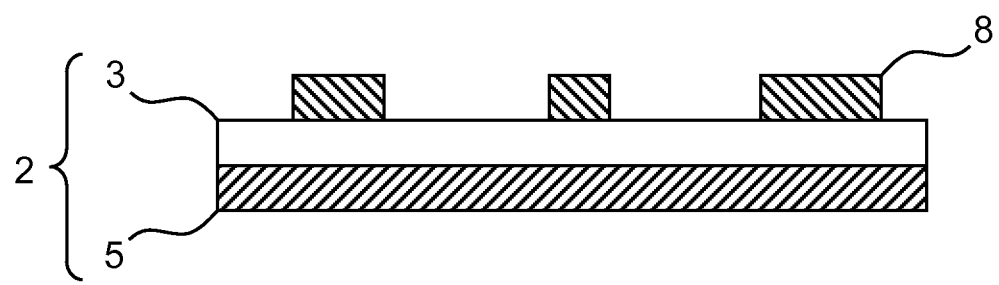
Figure 11B:
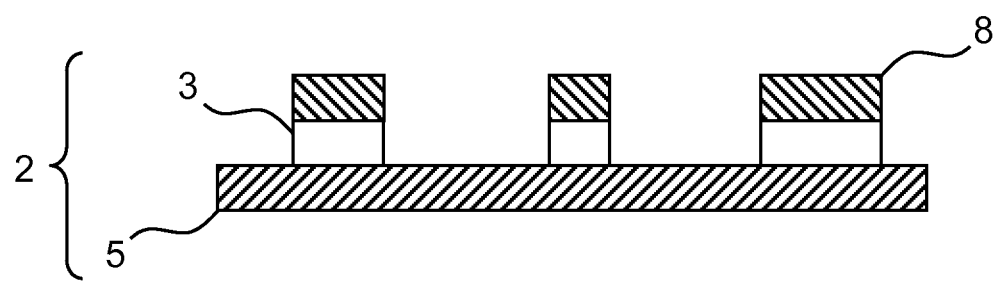

The invention is described by way of example below with reference to exemplary embodiments. The drawings are as follows:

FIG. 1 shows an overview of the manufacturing process;
FIG. 2 shows the first method step with the example of a sputtering device;
FIG. 3 shows an exemplary layer structure;
FIGS. 4a-4c show a schematic view of the second method step of the temperature treatment using a laser irradiation device;
FIGS. 5a-5b show a schematic view of a laser lighting module with a laser line generated by the latter;
FIG. 6 shows a high-convection furnace;
FIG. 7 shows the temperature treatment as a second method step in a high-convection furnace;
FIG. 8 shows a two-chamber furnace;
FIG. 9 shows the temperature treatment as a second method step in a two-chamber furnace;
FIG. 10 shows a reference etching process;
FIGS. 11a-b show the etching process according to the invention (III); and
FIGS. 12a-c show the temperature treatment with a pulsed Yb:YAG/disc laser in scan mode.

The reference numbers in all of the drawings have been kept consistent so that every component has the same reference number in all drawings. The drawings are initially described in detail. This is followed by two exemplary embodiments according to the invention.

FIG. 1 shows the method according to the invention for manufacturing a coated object 2 with its two or three method steps I coating, II heating and III etching. The two method steps I and III form the solution according to the invention, and a method step II—the etching—can be inserted optionally between the two method steps I and III. The starting materials, the coating material 3 and its carrier, the so-called substrate 5, which preferably comprises glass, are shown at top left.

The coating materials are one or more metal oxides, so-called TCOs, transparent, electrically conductive oxides (transparent, conductive oxides). In method step I, the substrate 5 is coated with 1 or more metal oxides. In method step II, the coated substrate 2 is heated through a temperature treatment, in order to adjust the electrical conductivity and the optical transparency of the coating 3, and in the optional method step III, the coating 3 is subjected to etching in order to form a surface texture 3a.

In this context, it is important that the method steps I, II and III are all strictly separated from one another. The result from method steps I, III and the optional method step II is a coated object 2 for a diverse assortment of end products 500, for example, thin-layer solar cells, windscreens, anti-fogging, radar anti-reflection claddings for airport buildings and so on.

FIG. 2 shows an exemplary coating device in the form of a sputtering unit 100 comprising a vacuum chamber 101, a power supply 105, an anode 106, which is covered here by the substrate 5, and a cathode 107. In the vacuum chamber 101, atoms and respectively molecules 110 are released from a solid body 3' provided as the target, which comprises a transparent, conductive metal oxide, by bombarding with energy-rich ions 109, which are accelerated within an electrical field, which is formed by the anode 106 and the cathode 107. These atoms or molecules 110 are deposited on the surface of a substrate 5, for example, a glass plate on rollers 120, which is moved at a constant velocity through the vacuum chamber 101. These atoms 110 then form a coating 3. With this gas-phase deposition, one or more layers can be applied to the substrate 5.

If the target material itself comprises a solid body 3' made of a pure metal, that is to say, without oxides, a so-called reactive sputtering can be used. With reactive sputtering, the coating 3 is formed through a chemical reaction of the atoms released from the target 3', that is to say, atoms of one of the previously named metals, with a reaction gas, in this case, oxygen, in order to generate an oxide layer 3 on the surface of the substrate 5. The chemical reaction for zinc with oxygen is as follows:

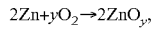

$$2Zn + yO_2 \rightarrow 2ZnO_y,$$

wherein a zinc oxide layer 2, which is preferably somewhat sub-stoichiometric, that is, $y<1$, is formed on the substrate 5. In this manner, several layers of different metal oxides can be applied through successively implemented reactive sputtering.

FIG. 3 shows an example of a coating according to the invention. This coating comprises 4 layers, which are arranged from top to bottom as follows: a TCO layer 3, which itself can be built up from several TCO layers of different TCOs, an interference layer 4a, a diffusion barrier 4 and a further interference layer 4b. The diffusion barrier 4 can also itself be formed as an interference layer.

The functions of the layers 4a, 4 and 4b will now be explained. In order to prevent electro-corrosion, the sodium-diffusion barrier 4 is inserted between the TCO layer 3 and the substrate 5, as presented in FIG. 3. The thickness of the diffusion-barrier layer 4 in this context is between 5 nm and 200 nm, preferably between 10 nm and 50 nm. Silicon oxide, silicon nitride, silicon carbide and mixtures and/or compounds of two or all of these substances can be used in particular. In this context, a slight deviation from the stoichiometric composition is advantageous. However, this should preferably not exceed a total of 10% otherwise the absorption of the diffusion barrier 4 becomes too high. In total, the absorption of this partial layer should not exceed 2%. This value is calculated as the difference between the sums of the light transmission and reflection with a wavelength of 515 nm for the layer system respectively with and without this diffusion barrier 4.

In addition to the diffusion-barrier effect, an anti-reflection effect is achieved through destructive interference of light-wave trains of wavelength $\lambda$ with a path difference $\lambda/2$ reflected at two different layer thresholds: a so-called interference anti-reflection. For this purpose, the interference layer 4a can be inserted both between the diffusion-barrier layer 4 and the TCO-layer 3, and a corresponding interference layer 4b can also be inserted between the diffusion-barrier layer 4 and the substrate 5, as shown in FIG. 3. The thickness of the interference layers 4a and respectively 4b is between 20 nm and 100 nm. The interference layers 4a, 4b act in an anti-reflective manner. Preferred materials are oxides, nitrides and carbides of silicon, aluminium, zinc, tin, titanium, zirconium, hafnium, vanadium, niobium, tantalum and mixtures of two or more of these substances. The diffusion-barrier layer 4 itself can also be formed as an interference layer.

FIGS. 4a, 4b and 4c show in a very schematic manner an exemplary temperature treatment device in the form of a laser-irradiation device 200, which heats the substrate body to a temperature $T_{IIa}$. Accordingly, FIG. 4a shows in a plan view a coated substrate body 2 in the form of rectangular panel which is moved at a constant velocity $V_{IIa}$ in the direction of the arrow. Two laser-lighting modules 208, which generate two illuminated regions 208b, represented by dotted lines, of which the light strikes the coating 3 of the substrate body 2 in an almost perpendicular manner in the form of a laser line 250, are mounted above the substrate body 2. The coating 3 is heated by the laser light. The laser line 250 is disposed perpendicular to the direction of movement of the substrate body 2.

The laser modules are arranged in such a manner that the generated linear lighting regions 208b arranged side-by-side together cover the entire width of the substrate body. As an alternative, it is also possible for each individual linear lighting region 208b to cover the entire width of the substrate body.

FIG. 4b shows a front view of the irradiation of the substrate body 2 by two laser lighting modules 208. Accordingly, the plane of the image is disposed perpendicular to the direction of movement of the substrate body 2. Here also, it is evident that both laser-lighting modules 208 arranged side-by-side cover the entire width of the substrate body.

FIG. 4c shows a lateral view of the irradiation of the substrate body 2. The laser beam 215 is disposed not quite perpendicular to the coated surface of the substrate body 2, in order to protect the laser lighting module 208 from self reflections on the substrate body 2. To illustrate this, the angle $\delta$ has been presented in an exaggeratedly large-scale. The sum of the lighting regions 208b always forms a sharp laser line, beneath which the substrate body 2 is displaced along its entire length at a constant velocity $V_{IIa}$ on a transport device 205.

FIG. 5a shows an exemplary laser lighting module 208, which, in each case, generates a lighting region 208b, which generates a laser line 250 with a sharp cross-section, as presented in FIG. 5b. Several lasers 210 are fixed on a fixing device 209 in the exemplary embodiment and are aligned parallel to one another in the exemplary embodiment at an equal distance along a straight line. The laser light, which is emitted by the lasers 210, passes through a collimator 220, which contains cylindrical lenses 221, which laterally limit and parallelise the laser light. The parallelised laser light then strikes a micro-lens array 230, which focuses the laser light through its aspherical lenses 231 onto a laser line 250, as shown in FIG. 5b.

For reasons of logical arrangement, only five focused laser beams have been shown in FIG. 5a. In reality, these laser beams are disposed much closer together, so that their beam cones 240 overlap one another, as illustrated in FIG. 5b. FIG. 5b shows the laser line 250 considerably enlarged by comparison with FIG. 5a. The beam cones 240 are ellipse-shaped in cross-section determined by the spherical lenses 231, wherein the ellipses 251 are all disposed with their long semi-axes along the laser line 250. The ellipses 251 overlap one another on the laser line 250. Each individual ellipse 251 corresponds in cross-section to a laser light focused by an aspherical lens 231 of the micro-lens array 230. In this context, an ellipse 251 need not necessarily be associated with a given laser 210. The width of the laser line 250 is very small by comparison with the length of the laser line 250. The ratio is preferably at least 1 to 100.

FIG. 6 shows a high-convection furnace 300 as a second possibility for the temperature treatment in method step II according to the independent claim. The coated substrate 2 is supplied to the high-convection furnace 300 in the form of rectangular panels on conveyor rollers 310 or conveyor belts 310 at a constant straight-line velocity $V_{IIb}$. The substrate layer 3 of the substrate 5 is heated by convection to a given temperature $T_{IIb}$. The temperature $T_{IIb}$ acts on the substrate body 2 for a given time $\Delta t$. The heated substrate body 2 then leaves the high-convection furnace 300.

FIG. 7 shows method step II in the high-convection furnace 300 in greater detail. The substrate body 2 displaced at a constant velocity $V_{IIb}$ on a transport device 310, such as a conveyor belt or conveyor rollers, is heated by radiant heaters 320. At least one ventilator 330 ensures a uniform mixing of the heated air. The coating 3 and the substrate 5 are heated by convection to a given temperature $T_{IIb}$. In this context, a heating plate 325 distributes this radiated heat from the radiant heater 320 uniformly along the direction of movement and therefore additionally ensures a homogeneous heating of the coating 3.

FIG. 8 shows a two-chamber furnace 350 or multi-chamber furnace or multi-zone furnace as a further possibility for temperature treatment in method step II. The coated substrate 2 in the form of rectangular panels is supplied at a constant straight-line velocity $V_{IIc}$ on conveyor rollers 310 or conveyor belts 310 to a first chamber of the two-chamber furnace 300. Through convection, the substrate layer 3 of the substrate 5 is heated uniformly over the time $\Delta t$ to a first temperature. After that, the substrate body is transported on the transport device into a second chamber. In the second chamber, the substrate body is heated uniformly by convection and radiation over the time $\Delta t$ to a second temperature.

FIG. 9 shows method step II in the two-chamber furnace 300 in greater detail. The substrate body 2 displaced at constant velocity $V_{IIc}$ on a transport device 310, such as a conveyor belt or conveyor rollers, is heated uniformly in the first chamber 370 by at least one hot-air fan 360. The coating 3 and the substrate 5 are heated by convection over the time $\Delta t$ to a given temperature between 350° C. and 650° C. After that, the bulkhead 380 is opened and the substrate passes into a shutter device 385. The shutter device separates the first chamber 370 from the second chamber 390 for reasons of thermal insulation, because different temperatures should predominate in the chambers 370 and 390.

Following this, the substrate is transported on conveyor rollers into the second chamber 390 of the two-chamber furnace 350. In the second chamber 390, the substrate is heated uniformly by at least one hot-air fan 360 and at least one radiant heater 320 over the time $\Delta t$ to a temperature between 350-700° C., preferably between 500° C. and 650° C. The heated substrate body 2 then leaves the two-chamber furnace 300.

FIG. 10 shows an etching process according to a reference method in partial steps from top to bottom. The substrate body 2 has been temperature treated in the preceding method step II. Now, the surface of the substrate body 2 is brought into contact with an acid, preferably dilute hydrochloric acid. The hydrochloric acid etches a roughening into the surface distributed homogeneously over the entire substrate. The roughened surface of the substrate now provides the desired optical scattering behaviour, for example, for thin-layer solar cells. In this context, see FIG. 10, only the uppermost and the lowest of the six individual drawings.

In the reference method, photo-lithography is used in order to generate more complex structures in the surface of a substrate body 2. Accordingly, a photo-layer 6 is first applied to the coating 3 which has cooled down in the meantime. After this, the photo-layer 6 is illuminated through a mask 7, so that the photo-layer 6 on the coating 3 disappears and the latter is accordingly exposed only at the places where the mask 7 allows the light to pass through. After this, the actual etching takes place, wherein preferably dilute hydrochloric acid or hydrofluoric acid etches a surface texture 3*a* into the coating 3 and, in fact, only at those places without the photo-layer. Following this, the residue of the photo-layer 6 is removed. The etching III is also preferably implemented in a continuous process. In this context, see all six individual drawings in FIG. 10.

FIGS. 11*a* and 11*b* show the etching process III according to the invention, wherein, after the temperature treatment II, the surface texture 3*a* of the coating 3 is statistically adjusted. In this context, the coated substrate 2 is illustrated in FIG. 11*a* with a statistically applied mask 8. FIG. 11*b* shows the coated substrate 2 after the implementation of the etching step.

An etching method in which a mask is applied to the coating before the etching as a non-closed layer by sputtering or in islands 8 has proved particularly advantageous. For example, in the case of a substrate 5 coated with a $ZnO_2$ layer 3, islands 8 or a non-closed layer of $SnO_2$ can be formed by sputtering.

As a second method of the etching process, a mask is generated in situ on the coating before the etching using a complex-former. By preference, at least one member of the group comprising oxalic acid, malonic acid and acetyl acetone, preferably oxalic acid or malonic acid is used as the complex-former. In this manner, insoluble metal complex salts are deposited in heaps on the substrate, wherein the heaps are distributed statistically as islands 8 on the surface of the substrate. For instance, with the use of zinc oxide as a coating, zinc malonate or zinc oxalate are formed. The formation of heaps can be further improved if acetic acid is added at the same time as or after the addition of the complex-former. In this manner, the contrast between metal-oxide heaps and the substrate is clearer, which is advantageous for the formation of the mask.

As a third method of the etching process, a non-reactive powder, preferably at least one member from the group comprising $Al_2O_3$, $SiO_2$ and $BaSO_4$ is deposited mechanically on the coating 3 before the etching, in order to generate a mask so that islands 8 are formed as a result.

As a fourth method of the etching process, oligomers, preferably siloxane oligomers, are scattered onto the coating and selectively bonded before the etching in order to generate a mask, so that islands 8 are distributed statistically on the surface of the coating 3.

By preference, after the generation of the mask, the etching is implemented with at least one Brønsted or Lewis acid, preferably with at least one member of the group comprising acetic acid, citric acid, formic acid, iron trichloride, aluminium trichloride and hydrochloric acid, by particular preference with hydrochloric acid. FIG. 11*b* shows the coated substrate 2 after the implementation of the etching process. Following this, as shown in the last partial diagram from FIG. 10, the mask can then be removed again.

FIGS. 12*a*, 12*b* and 12*c* show an alternative temperature treatment of the coating 3 of the substrate body 2 with a pulsed Yb:YAG/disc laser 210. This is an alternative to the laser temperature treatment with several coupled lasers, which is described in the first exemplary embodiment. The laser lighting module 208 here comprises a Yb:YAG/disc laser 210, a fibre-glass optic 260, optionally, a deflection mirror 265, a focusing module 270 and a transport device 290 driven by a motor 280, which displaces the laser lighting module 208 to and fro in a straight line transversely to the direction of displacement of the substrate body 2 and, in this manner, generates a laser line 250 on the substrate surface. In this context, see FIG. 12a and FIG. 12b.

The Yb:YAG/disc laser 210 is a solid-state laser, in which the active medium (the laser crystal) has the form of a disc. The laser beam 215 is generated through multiple passes of a pump radiation through the laser disc. A resonator mirror is vapour-deposited on the rear side of the crystal disc, the other mirror is the de-coupling mirror and is disposed at a distance from the disc. The advantage of this form of laser is the improved cooling of the laser crystal. This is glued to the mirror surface on a heat sink and, because of the heat dissipation over an entire base area of the laser disc, is only subjected to minimal mechanical stresses, thereby achieving good focusing by comparison with other high-power solid-state lasers. A typical crystal material is highly Ytterbium-doped YAG (Yttrium-Aluminium Garnet) in a so-called Yb:YAG-laser with an emission wavelength of 1030 nm.

By contrast with the generation of the laser line 250 described in FIGS. 5a-b, in which the laser line 250 is formed simultaneously by several lasers 210, the laser line 250 here is generated by a Yb:YAG/disc laser 210, of which the pulsed laser beam 215, which is guided through a fibreglass optic 260, for example, a laser-light cable, is deflected by a mirror 265 and focused by a focusing module 270, moved in a linear manner to and fro over its entire width, perpendicular to the direction of movement x, that is to say, in the y-direction of the substrate body 2. In this context, see FIGS. 12a and 12b. The movement of the laser lighting module 208 in FIG. 12a is implemented perpendicular to the plane of the drawing by a transport device 290, for example, a roller rail, driven by a motor 280.

In this context, the lighting region 208b, that is, the laser-beam focus on the substrate surface 3, can be circular or rectangular, as shown in FIG. 12c. A circular laser-beam focus is conventional and therefore easy to generate, but has the disadvantage that a flat surface cannot be tiled over the entire area with mutually adjacent circles. Gaps remain on the substrate surface. To avoid these gaps, the laser beam 215 must be moved in such a manner that the circles overlap on the substrate surface to ensure the most uniform possible coverage of the substrate surface. In this context, see FIG. 12c.

Another possibility is to guide the laser beam 215 optically within the laser lighting module 208 in such a manner that the laser-beam focus forms a rectangle, thereby allowing a gap-free coverage with an approximately chessboard-like tiling of the coating 3. A covering tiled with rectangles can be implemented more rapidly than a covering tiled (at the same scanning speed) with circles of the same area, because this first requires overlapping for the coverage. In this context, see also FIG. 12c. The rectangular laser focus can be achieved by guiding the laser beam 215 through a fibre-glass optic 260 of which the glass fibres provide a rectangular cross-section at the end. This laser beam 215 with a rectangular cross-section can be deflected by a mirror 265 and focused by a focusing module 270. See FIG. 12a in this context.

Since the mean scan velocity $v_{scan}$ of the Yb:YAG/disc laser 210 and the transport velocity $v_{substrate}$ of the substrate body 2 directed perpendicular to the latter are superimposed over one another, the laser beam 215 actually generates a zigzag line 250 on the surface of the substrate body 2, as shown in FIG. 12b. If the mean scan velocity $v_{scan}$ of the Yb:YAG/disc laser is sufficiently fast relative to the transport velocity $v_{substrate}$ of the substrate body, the tiling achieves coverage. With the to and fro movement, the laser beam 215 scans the width B twice in the time $T_s$ with the mean scan velocity $v_{scan}$ in the y-direction of the substrate body 2. Accordingly, $T_s=2B/v_{scan}$ applies. In this time $T_s$, in which the laser lighting module 208 has moved to and fro once in the y-direction, the substrate body 2 must have moved exactly by the length $\Delta x$ of the rectangular laser focus in the x-direction, so that the tiling achieves coverage:

$$\Delta x = v_{substrate} T_s = v_{substrate} 2B/v_{scan}$$

Accordingly, the following applies:

$$v_{scan} = \frac{2B}{\Delta x} \cdot v_{substrate}$$

Accordingly, if the velocities $v_{scan}$ and $v_{substrate}$ are matched with one another according to this equation, the laser lighting module 208 scans the substrate body 2 line by line covering the entire surface and can therefore heat the coating 3 of the substrate body 2 in a homogeneous manner. However, the rectangles overlap in this context. It is also conceivable that, so long as the laser lighting module 208 is scanning a line of the substrate body 2, the transport device 205 holds the substrate body 2 and moves it forward by the unit $\Delta x$ only between the line by line scans. Accordingly, a zigzag movement is excluded in every case, and the rectangles do not overlap.

In the following paragraphs, a first exemplary embodiment of the method will be described in detail with reference to the drawings.

A substrate 5, preferably made of glass, is coated in method step I with a conductive, transparent metal oxide, which comprises substantially zinc oxide, cadmium oxide, tin oxide, indium oxide or mixtures of two or more of these oxides.

The coating is implemented with a coating device 100 (see FIG. 2), which deposits the metal oxide on the substrate 5 by means of physical or chemical gas-phase deposition in a vacuum process. The coating is implemented at low substrate temperatures $T_f$. In this context, the substrates 5 are preferably not heated separately during or before coating. The deposition of the transparent, conductive layer 2 is implemented in a vacuum process by means of physical gas-phase deposition through sputtering or reactive sputtering and through vaporisation or thermal vaporisation or electron-beam vaporisation or laser-beam vaporisation.

The deposition of the transparent, conductive layer 3 can also be implemented in a vacuum process, chemically or especially through thermally activated chemical deposition or through plasma-activated chemical deposition or through laser-activated gas-phase deposition. In the deposition of the transparent, conductive layer 3, the chemical gas-phase deposition or the thermally activated chemical gas-phase deposition can especially also be implemented in each case only from one of the partial layers comprising the constitutive components and providing a maximum of one monolayer.

As a third option, the deposition of the transparent, conductive layer(s) 3 can be implemented in a wet chemical manner, for example, through a sol-gel process or through a printing process. This first exemplary embodiment describes the sputtering, which is also shown in FIG. 2, in detail. Atoms 110 are released from a solid body 3', which comprises a transparent, conductive metal oxide in a vacuum chamber 101 through bombardment with energy-rich ions 109. These atoms are deposited on the surface of a substrate 5, which is displaced through the vacuum chamber 101 in a continuous process at a constant velocity $v_I$ on a transport device 120.

The deposition of the transparent, conductive layer 3 is preferably implemented at a substrate temperature $T_I$, which is a maximum of 180° C., by further preference, a maximum of 160° C., by even greater preference, a maximum of 150° C., by special preference, a maximum of 130° C. The substrate body 2 coated in this manner with the coating 3 leaves the sputtering unit 100 on the transport device 120. By preference, the substrate is not individually pre-heated, but the deposition is implemented at the start on the substrate at room temperature. The temperature of the substrate increases uniformly through the coating process until a thermal equilibrium is set through convection and radiation losses. The above temperature is preferably obtained at the thermal equilibrium.

In the next, optional method step II for the adjustment of the electrical conductivity and optical transmission, the coated substrate 2 is subjected to a temperature treatment through laser irradiation, also referred to as laser tempering. The coating 3 in this context is heated by the laser tempering to a temperature $T_{IIa}$ of, for example, 200° C. The laser tempering is implemented almost perpendicular to the level surface of the coating 3 of the substrate body 2. As shown in FIG. 4c, the laser beam is inclined towards the perpendicular of the surface through a small angle δ, in order to protect the laser 210 from its own emitted light through reflection on the coating 3. The laser light generated by many individual lasers 210 is guided through collimators 220 and then through aspherical lenses 231. In this context, each laser lighting module 208, as described in greater detail with reference to FIG. 5a, is formed by at least two lasers 210, a collimator 220 with cylindrical lenses 221 and a so-called micro-lens array 230 with aspherical lenses 231. The aspherical lenses 231 of the micro-lens array 230 focus the laser light in a parallelised manner through the collimators 230, so that each individual beam forms a beam cone 240, which provides an elliptical cross-section at the focal point. The long primary axes of the ellipses 251 of this beam cone 240 are all disposed on a straight line, a so-called laser line 250. The linear conduction density $P_{lin}$ of this laser line 250 is, for example, 450 W/cm. In this context, the ellipses 251 overlap in the direction of their relatively longer semi-axis, as illustrated in FIG. 5b. The ellipses 251, especially the length of the two short semi-axes, are small by comparison with the length of the laser line 250. The ratio of the length to the width of the laser line 250 is advantageously greater than 100, wherein the width is determined by the short semi-axes of the ellipses 251. This achieves a sharp focus.

Each individual laser lighting module 208 generates a laser line 250. However, in order to irradiate the coated substrate 2 uniformly over its entire width, the laser lighting modules 208 are aligned in such a manner that they form a common laser line 250 on the coating 3. In this context, the individual lighting regions 208b, which are each generated by a laser lighting module 208, can overlap to form a common laser line 250, or the individual lighting regions 208b are arranged side-by-side in several strips and form a common laser line 250 in this manner.

Accordingly, the continuous process is advantageously used, in which the coated substrate 2 is moved on a transport device 205 at a constant velocity $V_{IIa}$ in a straight line, and the laser lighting modules 208 are disposed in stationary manner. The substrate width in this case is between 1 m and 6 m. The laser line 250 passes over the entire width of the substrate perpendicular to the direction of the movement, because the lighting regions 208b are arranged correspondingly side-by-side.

With this temperature treatment according to the invention using laser beams, approximately 10-20% of the radiated energy of the laser light is coupled into the layer 3.

The tempering with laser radiation is preferably implemented within a wavelength range from 800 nm to 1200 nm. In the case of tempering with laser radiation, diode lasers, especially with a wavelength from 808 nm or 950 nm, are preferably used for the method according to the invention in the wavelength range from 800 nm to 1000 nm, and solid-state lasers are preferably used in the wavelength range from 1000 nm to 1200 nm. For example, InGaAs diode lasers are used for the wavelength 950 nm. Laser diodes are very small and require only limited costs during operation. One useful property of laser diodes is their high modulation bandwidth. An approximately linear change of the output power can be achieved through modulation of the electric current which flows through the diode. Diode lasers are the most efficient radiation sources in the near infrared range and provide an efficiency up to 50% or more.

If the reflection spectrum of a TCO layer is considered, it will be established that, at the plasma edge, which is by definition a characteristic structure in a reflection spectrum, the absorption increases with an increasing wavelength, but the depth of penetration decreases. In solid bodies, the plasma edge occurs at the position in the spectrum where the plasma resonance occurs. There, the real component $\in 1$ of the dielectric constant provides a zero point. At $\in 1=1$, the reflection disappears. However, the absorption is relatively low at approximately 1000 nm. In order to exploit the laser power effectively, Nd:YAG lasers or Yb:YAG lasers are used especially in the wavelength range from 1000 nm to 1200 nm. An Nd:YAG laser or a Yb:YAG laser is a solid-state laser, which uses a neodymium or yttrium YAG crystal as the active medium. Nd:YAG denotes neodymium-doped yttrium aluminium garnet laser. The Nd:YAG laser emits in the infrared range with the wavelength 1064 nm. The Yb:YAG laser radiates with a wavelength of 1030 nm. However, this Yb:YAG laser is used by preference in the pulsed-scan mode. In this context, see FIGS. 11a-c, which describe an alternative laser treatment using a Yb:YAG disc laser. An Er:YAG laser, Ho:YAG laser or $CO_2$ laser is also suitable as an alternative. All of the lasers can be operated in a pulsed or continuous manner. The solid-state lasers can be embodied as rods or discs or fibres.

The laser tempering is followed by method step III. The coated substrate 2, which has cooled down in the meantime, is now etched in an etching device 400. The procedure for etching in this context is illustrated in FIG. 8. This optional etching step III can only be implemented if the density δ of the coating 3 has achieved a given value through the temperature treatment II. The third required parameter, the optical scattering behaviour of the coating 3, is adjusted through the etching. For this purpose, a given surface texture is preferably etched with dilute hydrochloric acid (0.1% to 5%). This etching is preferably implemented as a continuous process in which the etching device is fixed, and the coated substrate 2 is moved through the etching device 400 at a constant velocity $v_{III}$.

The following paragraphs describe a second exemplary embodiment according to the invention in detail with reference to the drawings. In this second exemplary embodiment, method step I corresponds to that from the first exemplary embodiment, and the description will not be repeated here. In method step II of this second exemplary embodiment, the temperature treatment device is a high-convection furnace 300. In the high-convection furnace 300, the coated substrate 2 is substantially heated in a uniform manner by convection in order to adjust the two required parameters of electrical conductivity and optical transmission.

The substrate body 2, a coated glass, moves along a conveyor belt 310 or on rollers 310 at a constant velocity $V_{IIb}$ through the high-convection furnace 300. The air heated by the radiant heaters 320 heats the coating 3, cools down somewhat as a result of the thermal transfer to the coating 3; it is driven upwards by the ventilators 330, which also ensure that new hot air is driven downwards onto the coating 3. In this context, see FIG. 7.

Driven by ventilators 330, the convection is kept uniformly in motion in this manner, and accordingly, the coating is uniformly heated, for example, to the temperature $T_{IIb}=200°$ C. As shown in FIG. 7, the ventilators 330 can be arranged in rows along the transport direction of the transport device 310, wherein, in each case, two adjacent ventilators 330 rotate in contrary motion, so that the rising and falling convection currents reinforce one another in an advantageous manner. The thermal transmission occurs here not only through convection, that is, through the transport of particles, but also directly through radiation and through thermal conduction through the substrate 5. Convection represents the largest proportion of the heating of the coating 3 in this context, while the proportions of radiation and thermal conduction are substantially smaller. On the upper side of the substrate body 2, some of the heat from the coating is absorbed by radiation and convection; some of the radiation and convection is reflected, and some of the radiation and convection is allowed through (transmission). On the lower side of the substrate body 2, some of the heat passes through the substrate 5 and accordingly reaches the coating 3 through thermal conduction from below.

As described with reference to FIGS. 8 and 9, as an alternative, the heating of the substrate body 5 can also be implemented through radiation and convection in a two-chamber furnace 350. In the two-chamber furnace 350, hot-air fans 360, which heat the substrate body 2 in a uniform manner through convection, are also used alongside radiant heaters 320.

The two physical parameters to be adjusted, electrical conductivity and optical transmission, can be influenced by the temperature $T_{IIb}$ and the duration $\Delta t_{IIb}$ of the temperature treatment. This method step II is followed by an etching step III, which was described with reference to the first exemplary embodiment.

With laser irradiation, as described in the first exemplary embodiment, or temperature treatment in a high-convection furnace or two-chamber furnace, as described in the second exemplary embodiment, the electrical and optical conductivity are considerably improved, wherein the best results are achieved with laser tempering.

With these two temperature treatments (II), a specific resistance from 100 µΩcm to 1000 µΩcm, preferably from 200 µΩcm to 750 µΩcm can be achieved; an electron concentration from $2\times10^{20}$ cm$^{-3}$ to $8\times10^{20}$ cm$^{-3}$, and a charge-carrier mobility between 10 cm²/Vs and 75 cm²/Vs, preferably between 20 cm²/Vs and 45 cm²/Vs can be achieved.

All of the features described and/or illustrated can be advantageously combined with one another within the framework of the invention. The invention is not restricted to the exemplary embodiments.

The invention claimed is:

1. A method for manufacturing a coated object, comprising:
   depositing at least one transparent, conductive metal-oxide layer on a substrate;
   depositing a complex-former on the conductive metal-oxide layer, so that heaps of insoluble metal complex salts comprising the metal of the conductive metal-oxide layer form on the conductive metal-oxide layer, wherein the heaps are distributed statistically on the conductive metal-oxide layer, and thereby form a mask in-situ; and
   performing an etching process to statistically adjust a surface texture of the conductive metal-oxide layer based on the statistically applied mask.

2. The method of claim 1, further comprising heat treating the transparent, conductive layer after the deposition and before the etching process.

3. The method of claim 1, further comprising forming the mask using the complex-former by a wet-chemical immersion or spraying process.

4. The method of claim 3, wherein the complex-former comprises oxalic acid, malonic acid, acetyl acetone, or combinations thereof.

5. The method of claim 3, wherein a non-complex-forming acid is used at the same time as the complex-former.

6. The method of claim 1, further comprising forming the mask in situ using a non-complex-forming acid.

7. The method of claim 1, wherein the etching is performed using a Brønsted acid or Lewis acid.

8. The method of claim 7, wherein the Brønsted acid or Lewis acid comprises acetic acid, citric acid, formic acid, iron trichloride, aluminium trichloride, hydrochloric acid, or combinations thereof.

9. The method of claim 1, wherein the metal-oxide layer comprises ZnOy doped with Al, where $0<y\leq 1$.

10. The method of claim 1, wherein adjusting the surface texture is performed using an etching step within a continuous process.

11. The method of claim 2, wherein the heat treatment is performed as a continuous process.

12. The method of claim 1, wherein a diffusion barrier is provided between the substrate and the transparent, conductive layer.

13. The method of claim 12, wherein an optical interference layer is provided between the substrate and the transparent, conductive layer or between the substrate and the diffusion barrier.

14. The method of claim 13, wherein the diffusion barrier is also formed as an optical interference layer.

15. The method of claim 1, wherein the transparent, conductive layer is deposited by sputtering, vaporization, chemical gas-phase deposition, sol-gel process, or a printing process.

16. The method of claim 15, wherein the transparent, conductive layer is deposited in individual partial layers with each layer comprising one of the constitutive components and providing a maximum of one mono-layer.

17. The method of claim 15, wherein the vaporization is thermal vaporization, electron-beam vaporization, or laser-beam vaporization.

18. The method of claim 15, wherein the transparent, conductive layer is deposited through plasma-activated chemical or laser-activated chemical gas-phase deposition.

19. A method for coating, comprising:
   depositing a transparent, conductive metal-oxide layer on a substrate;
   depositing a mask on the metal-oxide layer using a complex-former so that insoluble metal complex salts cover portions of the metal-oxide layer and leave other portions exposed, the salts comprising the metal of the conductive metal-oxide layer;

etching the exposed portions of the metal-oxide layer process to statistically adjust a surface texture of the metal-oxide layer; and removing the mask.

20. The method of claim 19, further comprising heating after the deposition of the mask and before the etching process.

21. The method of claim 20, wherein the heating process adjusts the electrical conductivity and the optical transparency of the metal oxide layer.

22. The method of claim 19, wherein the surface texture of the exposed portions of the metal-oxide layer are adjusted so that the metal oxide layer adequately scatters light.

* * * * *